United States Patent
Likhanskii et al.

(10) Patent No.: US 9,761,410 B2
(45) Date of Patent: Sep. 12, 2017

(54) APPARATUS AND METHOD FOR IN-SITU CLEANING IN ION BEAM APPARATUS

(71) Applicant: Varian Semiconductor Equipment Associates, Inc., Gloucester, MA (US)

(72) Inventors: Alexandre Likhanskii, Malden, MA (US); Jay T. Scheuer, Rowley, MA (US); William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/012,245

(22) Filed: Feb. 1, 2016

(65) Prior Publication Data

US 2017/0221678 A1    Aug. 3, 2017

(51) Int. Cl.
*H01J 37/30*    (2006.01)
*H01J 37/317*    (2006.01)

(52) U.S. Cl.
CPC ...... *H01J 37/3007* (2013.01); *H01J 37/3171* (2013.01)

(58) Field of Classification Search
CPC ............. H01J 37/3211; H01J 37/32091; H01J 37/3244; H01J 37/32715; H01J 37/32568; H01J 37/3255; H01J 37/32871; H01J 37/32422; H01J 37/32495; H01J 37/32651; H01J 2237/335
USPC ......... 250/396 R, 397, 492.1, 492.2, 492.21, 250/492.22, 492.23, 492.3
See application file for complete search history.

(56) References Cited

U.S. PATENT DOCUMENTS

| | | |
|---|---|---|
| 6,093,625 A | 7/2000 | Wagner et al. |
| 2016/0148789 A1* | 5/2016 | Chen ................ H01J 37/32357 134/1.2 |

OTHER PUBLICATIONS

Kevin Anglin, et al., In-Situ Plasma Cleaning of Process Chamber Components, U.S. Appl. 14/820,747, filed Aug. 7, 2015.

* cited by examiner

*Primary Examiner* — Nicole Ippolito (57) ABSTRACT

An apparatus may include an electrostatic filter having a plurality of electrodes; a voltage supply assembly coupled to the plurality of electrodes; a cleaning ion source disposed between the electrostatic filter and a substrate position, the cleaning ion source generating a plasma during a cleaning mode, wherein a dose of ions exit the cleaning ion source; and a controller having a first component to generate a control signal for controlling the voltage supply assembly, wherein a negative voltage is applied to at least one of the plurality of electrodes when the plasma is generated.

20 Claims, 9 Drawing Sheets

APPARATUS AND METHOD FOR IN-SITU CLEANING IN ION BEAM APPARATUS

FIELD OF THE DISCLOSURE

The disclosure relates generally to techniques for manufacturing electronic devices, and more particularly, to techniques for reducing contamination in ion implantation apparatus.

BACKGROUND OF THE DISCLOSURE

Ion implantation is a process for introducing of introducing dopants, additives, or impurities into a substrate via bombardment. Known ion implantation systems or apparatus may comprise an ion source and a series of beam-line components. The ion source may comprise a chamber where desired ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having desired species, shape, energy, and other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

In beamline ion implanters, the ion implanter system generates a stable, well-defined ion beam for a variety of different ion species and extraction voltages to desirably operate the ion source for extended periods of time, while avoiding the need for maintenance or repair. After several hours of normal operation using source gases (such as $AsH_3$, $PH_3$, $BF_3$, and other species), beam constituents may eventually create deposits on beam optics. Beam optics within a line-of-sight of a wafer to be implanted may also become coated with residues from the wafer, including Si and photoresist compounds. These residues build up on the beam-line components, causing spikes in the DC potentials during normal operation (e.g., in the case of electrically biased components) and eventually flake off, causing an increased likelihood of particulate contamination on the wafer.

To mitigate possible flaking issues, components having buildup may be removed for replacement or for cleaning periodically, requiring significant down time, as well as possible replacement cost expense. Directing an ion beam along a beamline to perform cleaning instead or implantation is also possible. A drawback of this approach is because shadowed surfaces of components not in the direct line of sight of the ion beam, including surfaces facing a wafer, may not be etched by the ion beam, allowing buildup and flaking to occur on the shadowed surfaces.

In electrostatic filters, for example, shadowed surfaces of electrostatic rods not exposed to the ion beam may not be effectively cleaned by the ion beam, and may directly face a substrate, providing an unwanted source of particles. With respect to these and other considerations the present embodiments are provided.

SUMMARY

In one embodiment, an apparatus may include an electrostatic filter having a plurality of electrodes; a voltage supply assembly coupled to the plurality of electrodes; a cleaning ion source disposed between the electrostatic filter and a substrate position, the cleaning ion source generating a plasma during a cleaning mode, wherein a dose of ions exit the cleaning ion source; and a controller having a first component to generate a control signal for controlling the voltage supply assembly, wherein a negative voltage is applied to at least one of the plurality of electrodes when the plasma is generated.

In another embodiment, a system may include a processing ion source to generate a processing ion beam in a processing mode of operation; a beamline component disposed downstream of the processing ion source; a cleaning ion source disposed between the beamline component and a substrate position; and a controller having a first component generate a control signal, wherein a negative voltage is applied to the beamline component with respect to the cleaning ion source when a plasma is generated in the cleaning ion source.

In a further embodiment, a method may include disposing a cleaning ion source between a substrate position and an electrostatic filter having a plurality of electrodes; generating a plasma in the cleaning ion source, wherein ions exits an aperture of the cleaning ion source; coupling a voltage supply assembly to the plurality of electrodes, wherein a plurality of voltage supplies of the voltage supply assembly are connected to the plurality of electrodes, respectively; and generating a control signal controlling the voltage supply assembly, wherein a negative voltage is applied to at least one of the plurality of electrodes when the plasma is generated in the cleaning ion source.

The drawings are not necessarily to scale. The drawings are merely representations, not intended to portray specific parameters of the disclosure. The drawings are intended to depict typical embodiments of the disclosure, and therefore are not to be considered as limiting in scope. In the drawings, like numbering represents like elements.

DETAILED DESCRIPTION

A system, apparatus and method in accordance with the present disclosure will now be described more fully hereinafter with reference to the accompanying drawings, where embodiments of the system, apparatus and method are shown. The system, apparatus and method may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Figure 1:
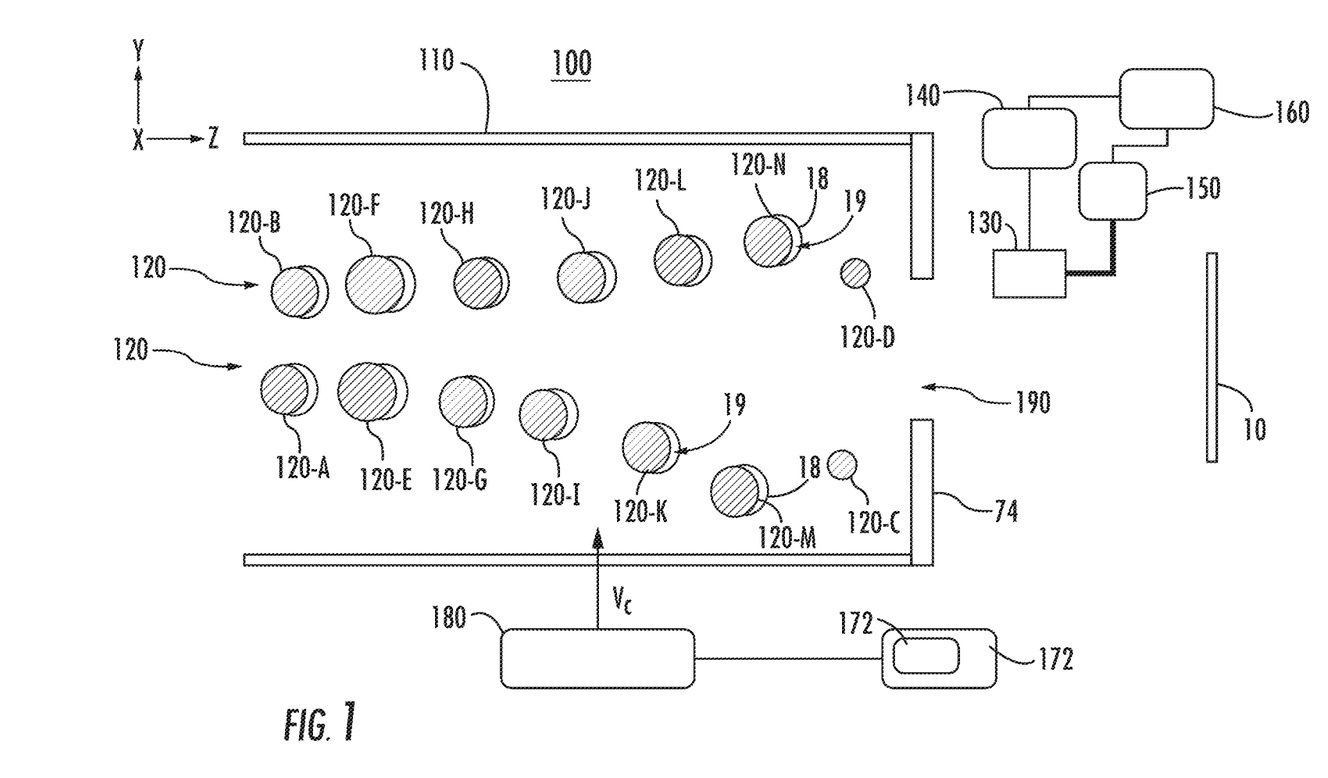
FIG. 1 and presents a block diagram of an apparatus according to embodiments of the disclosure.

In various embodiments, systems, apparatus, and methods are provided for in-situ cleaning of components in an ion beam apparatus. FIG. 1 and presents a block diagram of an apparatus 100 according to embodiments of the disclosure. The apparatus 100 may include an electrostatic filter 110, as will be described in greater detail. In exemplary embodiments, the electrostatic filter 110 is a beam-line component configured to independently control deflection, deceleration, and focus of an beam (not shown). As will be described in greater detail below, the electrostatic filter 110 may include a configuration of electrodes, also referred to herein as "electrostatic elements," (e.g., ion beam optics) comprising a set of upper electrodes and a set of lower electrodes. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at a given point along the central ion beam trajectory for independently controlling deflection, deceleration, and/or focus of an ion beam. In various embodiments, the electrostatic filter 110 and similar embodiments disclosed below may extend several tens of centimeters along the Z-axis and X-axis, as well as along the Y-axis. The embodiments are not limited in this context.

As shown, the electrostatic filter 110 includes a plurality of conductive electrostatic elements, shown as electrostatic elements 120, and corresponding to a plurality of beam-line electrodes (e.g., graphite electrode rods). In one embodiment, the electrostatic elements 120 are conductive beam optics disposed along an ion beam-line, as shown. In this embodiment, the electrostatic elements 120 are arranged in a symmetrical configuration, wherein the electrostatic elements 120-A and 120-B represent a set of entrance electrodes, the electrostatic elements 120-C and 120-D represent a set of exit electrodes, and the remaining electrostatic elements 120-E to 120-N represent several sets of suppression/focusing electrodes. As shown, a given set of electrode pairs provides a space/gap to allow an ion beam (e.g., a ribbon beam) to pass therethrough. In exemplary embodiments, the electrostatic elements 120 are provided in a chamber 74.

In one embodiment, the electrostatic elements 120 include pairs of conductive pieces electrically coupled to one another. Alternatively, the electrostatic elements 120 may be a series of unitary structures including an aperture for an ion beam to pass therethrough. In the embodiment shown, upper and lower portions of a given electrode pair may have different potentials (e.g., in separate conductive pieces) in order to deflect the ion beam passing therethrough. Although the electrostatic elements 120 are depicted as seven (7) pairs (e.g., with five (5) sets of suppression/focusing electrodes), any number of elements (or electrodes) may be utilized in various embodiments. For example, the configuration of electrostatic elements 120 may utilize a range of three (3) to ten (10) electrode sets.

As further shown in FIG. 1, the apparatus 100 may include a cleaning ion source 130, where the cleaning ion source 130 is disposed between the electrostatic filter 110 and a substrate position, represented by a substrate 10. As detailed below, the cleaning ion source 130 may be used to generate a cleaning plasma during a cleaning mode, wherein ions exit the cleaning ion source 130, and may be provided to clean components of the electrostatic filter 110, for example.

The apparatus 100 may include a power supply 140 to generate a plasma in the cleaning ion source 130, as well as a gas source 150 coupled to the cleaning ion source. The gas source 150 may provide gas to generate ion species such as inert gas ions to be used for cleaning the electrostatic filter 110, and in particular, for cleaning electrodes of the electrostatic filter 110. The gas source 150 may provide chemically active gas to the cleaning ion source 130, such as fluorine, wherein chemically active ions are generated and attracted through aperture 190 so as to impinge upon the electrodes. The embodiments are not limited in this context. The apparatus 100 may also include a controller 160 to operate the power supply 140 and gas source 150, so that the cleaning ion source 130 may be provided with power and a source of gas. In other embodiments, rather than just one gas source, a gas assembly may be coupled to the cleaning ion source 130, where the gas assembly provides to the cleaning ion source 130 a mixture of gases received from different gas sources, wherein a plurality of different ion species are generated and impinge upon the electrodes of electrostatic filter 110.

As further shown in FIG. 1, the apparatus 100 may include a voltage supply assembly 180 to generate voltages at the electrostatic elements 120. The voltages, shown as Vc, may be in particular be a negative voltage(s) applied to the electrostatic elements 120 to attract positive ions generated by the cleaning ion source 130. The apparatus 100 may further include a controller 170 having a first component 172 to generate a control signal for controlling the voltage supply assembly 180. The control signal may cause the voltage supply assembly 180 to apply a negative voltage to at least one of a plurality of electrodes of the electrostatic filter 110, that is, to at least one of the electrostatic elements 120. In various embodiments, this control signal may be generated when a plasma is generated cleaning ion source 130. The controller 170 may be embodied in logic as well as memory, and may include any combination of hardware and software to control at least the operation of the voltage supply assembly 180. While the controller 160 is shown as a separate element, in some embodiments, the controller 170 may include the controller 160 to control operation of the cleaning ion source 130 in addition to the voltage supply assembly 180.

In some embodiments, a negative direct current (DC) voltage may be applied by the voltage supply assembly 180 to at least one electrode of the electrostatic filter 110. This negative voltage may serve to attract positive ions generated by the cleaning ion source 130 to the electrode receiving the negative voltage. The ions may act to clean the electrode by physical sputtering, be reactive ion etching, or by other known ion etching mechanisms. As discussed below, this cleaning may be especially useful to clean certain portions of the apparatus 100 including shadowed surface regions 19 of the electrostatic elements 120. As shown in FIG. 1, these shadowed surface regions 19 may tend to accumulate deposits 18 during operation of the apparatus 100 to process the substrate 10 with an ion beam. Accordingly, the controller 170 may operate the voltage supply assembly 180 in conjunction with operation of the cleaning ion source 130 to provide in-situ cleaning of the electrostatic elements 120.

As detailed further below, in additional embodiments, the voltage supply assembly 180 may include a plurality of voltage sources (not separately shown in FIG. 1) independently coupled to the electrostatic elements 120 of the electrostatic filter 110. This individual coupling of a given voltage source to a given electrostatic element facilities application of different voltages to different electrostatic elements, including time-varying voltages. In this manner, cleaning of the electrostatic elements may be tailored and optimized according to the degree of cleaning, the spatial regions of an electrostatic elements to be cleaned, and other considerations. In some embodiments the plurality of voltage sources may also be used for providing voltages to different electrostatic elements during operation of the electrostatic filter in a processing mode where an ion beam is directed to the substrate 10.

Figure 2:
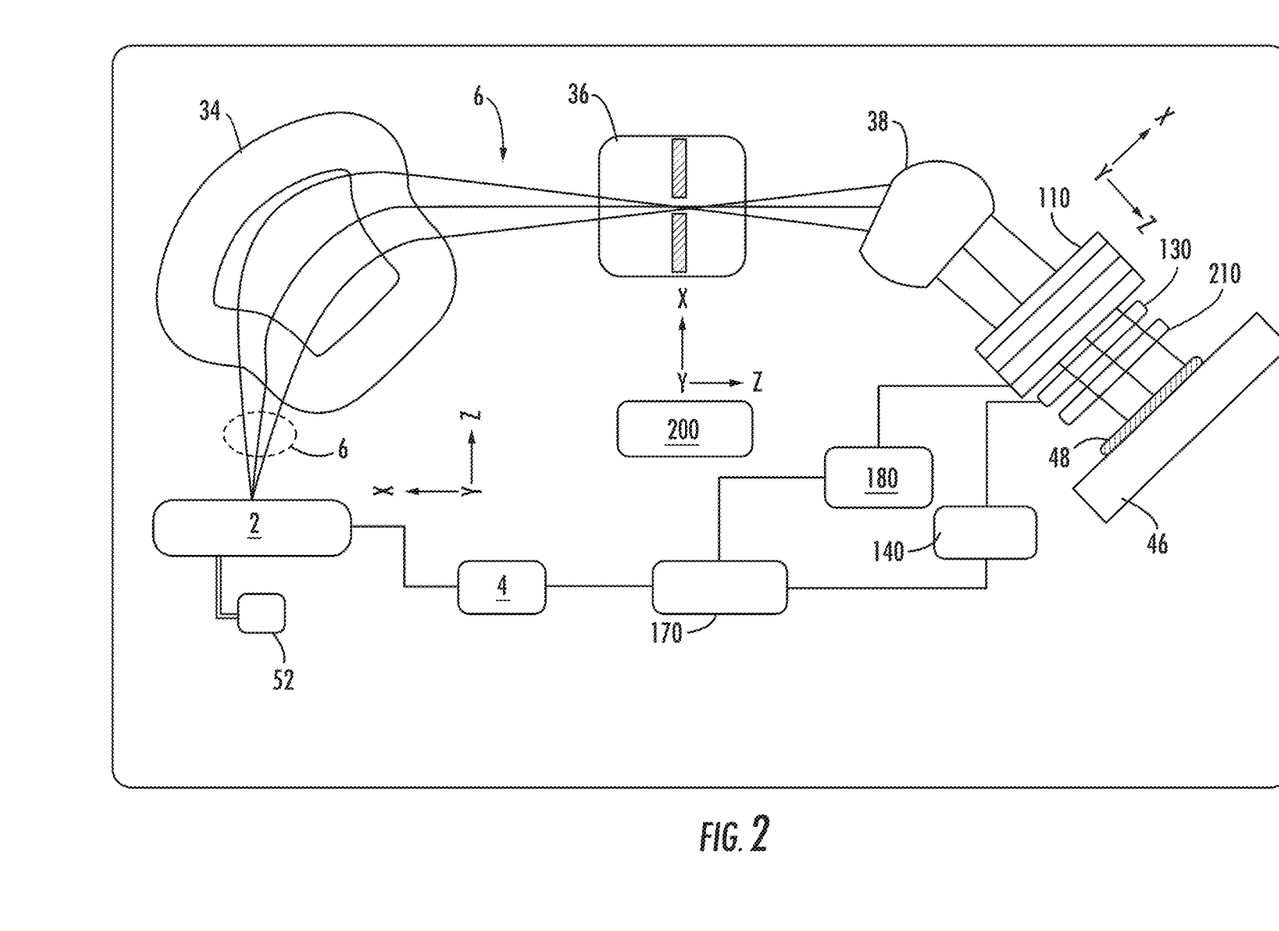
FIG. 2 shows an exemplary embodiment demonstrating a system in accordance with the present disclosure.

Referring now to FIG. 2, an exemplary embodiment is shown demonstrating a system 200 in accordance with the present disclosure. The system 200 may be configured as a beamline ion implantation system containing, among other components, an ion source 2 for producing an ion beam 6, and a series of beam-line components. The ion source 2 may comprise a chamber for receiving a flow of gas and generating ions. The ion source 2 may also comprise a power source and an extraction electrode assembly disposed near the chamber (not shown). The beam-line components may include, for example, a mass analyzer 34, a first acceleration or deceleration stage 36, a collimator 38, an electrostatic filter (EF) 110 for accelerating or decelerating the ion beam 6, and a plasma flood source 210 for neutralizing the ion beam 6. A gas source, in some embodiments a reactive gas source, may provide gas to the plasma flood source 210. Additionally, the controller 170 may include logic to coordinate operation of the cleaning ion source 130 and operation of the voltage supply assembly 180.

In exemplary embodiments, the beam-line components may filter, focus, and manipulate the ion beam 6 to have a desired species, shape, trajectory, energy, and other qualities. The ion beam 6 may be directed by at least one beamline component toward a substrate chamber, or substrate stage, and in the particular example of FIG. 2, to a substrate 10 mounted on a platen or clamp, shown as the substrate stage 46. The substrate 10 may be moved in one or more dimensions (e.g., translate, rotate, and tilt).

As shown, there may be a feed sources, shown as source 52. In some embodiments, material provided from a feed source may include source material for implantation, deposition, or cleaning. The source material may contain dopant species introduced into the substrate in the form of ions, or may contain other species depositing on surfaces of the system 200 during operation in a processing mode. In the embodiment of FIG. 2, the cleaning ion source 130 is shown as disposed between the plasma flood source 210 and electrostatic filter 110. In other embodiments, the cleaning ion source 130 may be disposed downstream of the plasma flood source 210 or adjacent to the plasma flood source 210, while in still further embodiments, the cleaning ion source 130 may also be employed as a plasma flood source.

Figure 3A:
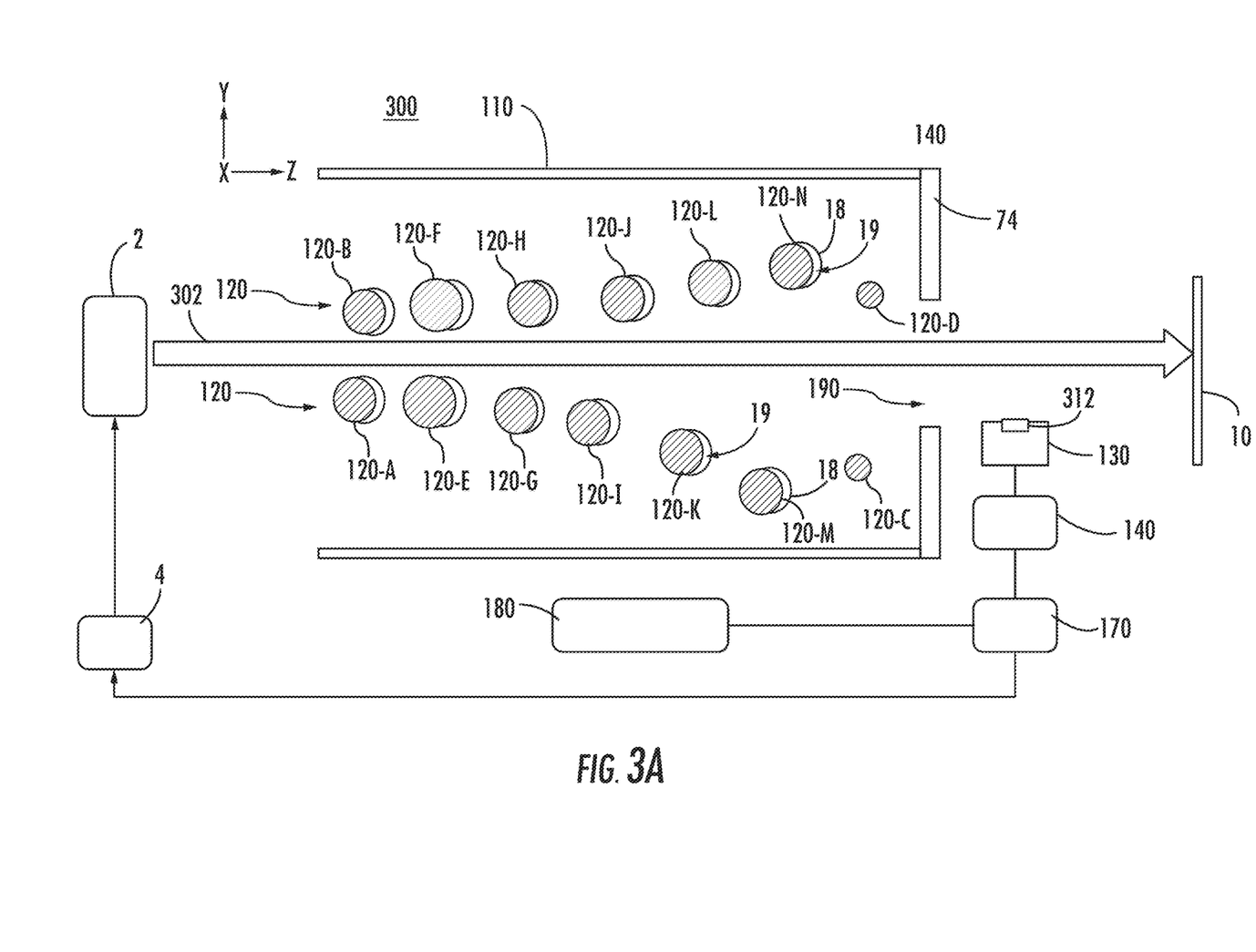
FIG. 3A and FIG. 3B illustrate exemplary operation of a system according to embodiments of the present disclosure.
Figures 3B, 3C, 3D:
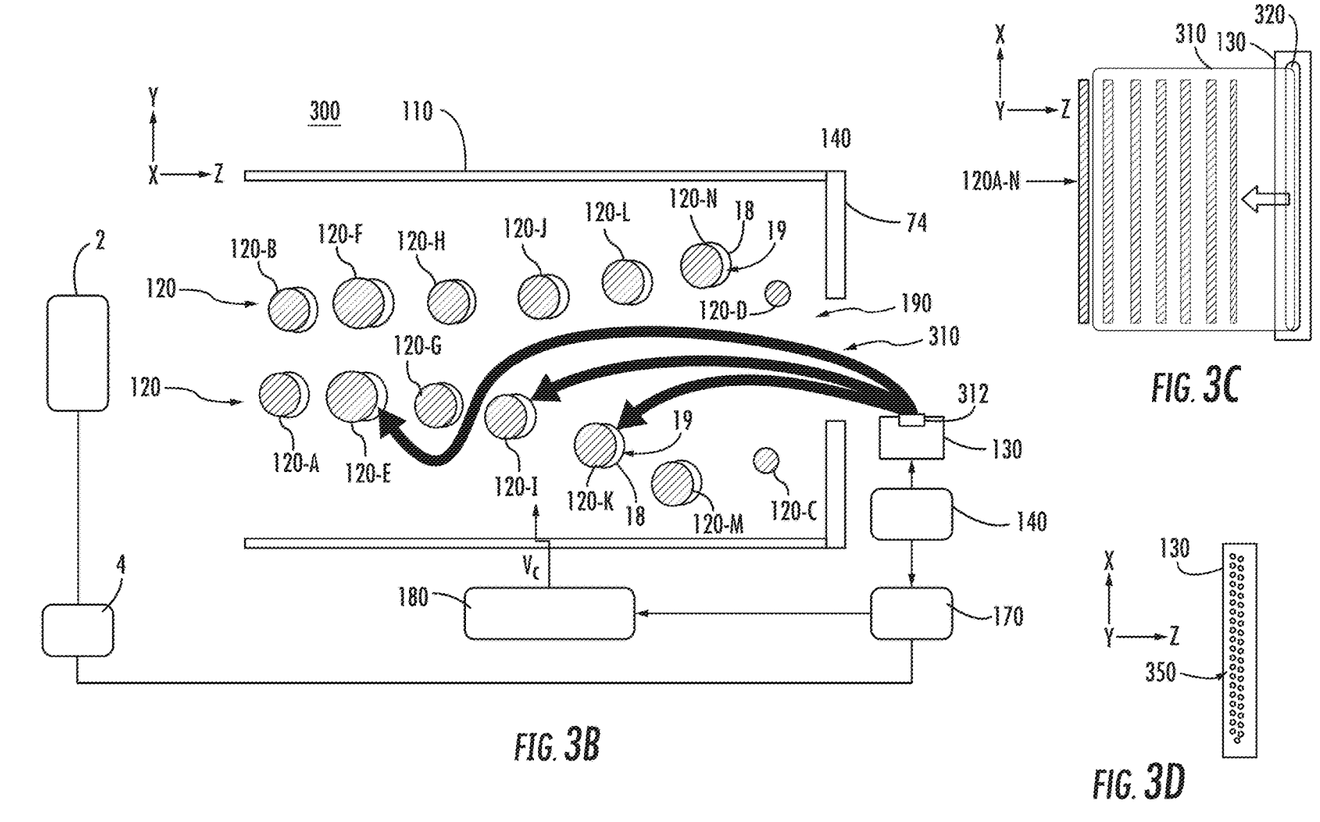
FIG. 3C shows a top view of a variant of a cleaning ion source according to embodiments of the disclosure.
FIG. 3D shows another cleaning ion source according to further embodiments of the disclosure.

Turning now to FIG. 3A and FIG. 3B, there is shown operation of a system 300 according to embodiments of the present disclosure. The system 300 may represent a beamline ion implantation system, for example. In FIG. 3A there is shown a processing mode of operation. In the example shown, the controller 170 may send a signal to the power supply 4 to generate a plasma in a processing ion source, represented by the ion source 2, wherein a processing ion beam, shown as an ion beam 302, is generated by the ion source 2. The ion beam 302 may be directed by various beamline components (not shown) to the electrostatic filter 110. In some embodiments, in a processing mode, the ion beam 302 passing through the electrostatic elements 120 along the beam-line may include boron or other elements for implantation into substrate 10, or for condensation on substrate 10. This may result in formation of the deposits 18, as shown and discussed above with respect to FIG. 1. These deposits 18 may in particular form in shadowed surface regions 19 where the ion beam 302 does not impact during operation in a processing mode, as the ion beam 302 is conducted to the substrate 10.

Turning now to FIG. 3B there is shown the operation of the system 300 in a cleaning mode. In the cleaning mode, the elements of a beamline of system 300 used to generate and propagate the ion beam 302, including ion source 2, may be turned off. In this manner, no primary ion beam for processing the substrate 10 is present. The controller 170 may generate a control signal to turn on power to cleaning ion source 130, generating a plasma in cleaning ion source 130. The controller 170 may additionally activate voltage supply assembly 180 to generate a negative voltage for application to at least one electrode, such as electrostatic element 120-E, electrostatic element 120-G, electrostatic element 120-I, electrostatic element 120-K, and other electrodes. As detailed below, this voltage may be applied to the at least one electrode in a constant mode, or in a time-varying mode. When a plasma is generated in the cleaning ion source 130, ions 310 may exit the cleaning ion source through an aperture 312. The ions 310, which may be positive ions, may be attracted to components biased at a negative voltage. In various embodiments, a magnitude of the negative voltage may be at least 500 V, meaning that the components are biased at −500 V, −1000 V, −5000 V or other greater negative voltage. The embodiments are not limited in this context. Accordingly, the ions 310 may be attracted to at least one electrostatic element, as shown in FIG. 3B. The ions 310 may have trajectories, such as straight or curved trajectories, causing the ions to impinge upon certain surfaces of the electrostatic elements 120 as shown. Because the ions 310 are generated in a cleaning ion source 130 located downstream of the electrostatic elements 120, the ions 310 may generally have trajectories directed upstream, and accordingly may often impinge upon shadowed surface regions 19, as shown. As noted above, a deposit 18 may build up on the shadowed surface region 19 during processing mode when the ion beam 302 includes condensing species tending to deposit on surfaces not exposed directly to the ion beam 302. Accordingly, the cleaning mode provided by the cleaning ion source 130 provides a convenient mechanism to remove the deposits 18 without having to remove the electrostatic elements 120.

In various embodiments, the operations depicted in FIG. 3A and FIG. 3B may be repeated in a cyclical fashion according to a determined or predetermined recipe. The processing mode may be employed to process a given number of wafers (substrates) calculated or measured to create a given amount of deposit 18 on the electrostatic elements 120. Once the given number of wafers is processed, the cleaning mode may be initiated to remove or reduce the amount of deposit 18. In this manner, this cycling between processing mode and cleaning mode may be continued through any number of cycles without requiring external servicing of the electrodes.

Turning now to FIG. 3C there is shown a top view of a variant of the cleaning ion source 130, where the cleaning ion source 130 is elongated along the X-axis of the Cartesian coordinate system shown. The cleaning ion source 130 may include an elongated aperture 320, as shown, where the elongated aperture generates the ions 310 in the form of a ribbon beam or multiple ribbon beams having a width along the X-axis sufficient to cover an entirety of the width of the electrostatic elements 120, as shown. Exemplary dimensions of the aperture 320 along the X-axis direction may be 300 mm to 500 mm and in the Y-axis direction 10 mm to 50 mm. The embodiments are not limited in this context. In one variant of the cleaning ion source 130, shown in FIG. 3D, a series of small holes may be provided, generally defining an elongated aperture along the X-axis, while having a smaller overall aperture area. This may serve to reduce pressure at various locations in a beamline to an acceptable level if needed.

Figure 4A:
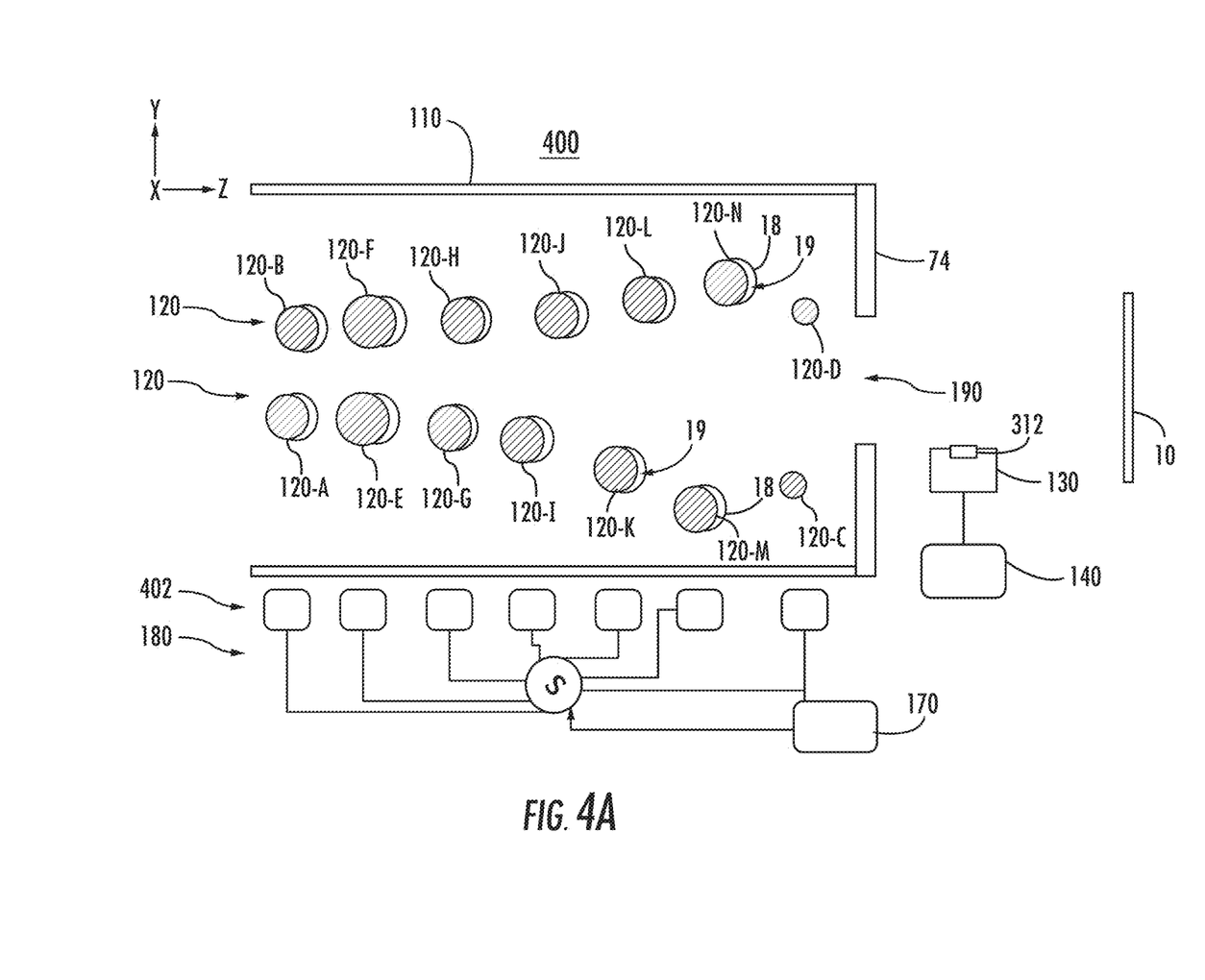
FIG. 4A shows an apparatus according to further embodiments of the disclosure.

Turning now to FIG. 4A there is shown an apparatus 400 according to further embodiments of the disclosure. The apparatus 400 may include the electrostatic filter 110 as described above, as well as a cleaning ion source 130. In this embodiment, the apparatus 400 includes a voltage supply assembly 180 having a plurality of voltage supplies, shown as voltage supplies 402. In one implementation, for X number of electrostatic elements 120, X number of voltage supplies 402 may be provided, where a given voltage supply 402 is dedicated to a given electrostatic element 120. This coupling allows voltage to be applied to a given electrostatic element independently of any voltages applied to other electrostatic elements. In the embodiment of FIG. 4A, a negative voltage may be applied to one electrostatic element or any number of electrostatic elements according to a targeted procedure.

In some embodiments, a control signal output by the controller 170 may generate a time-varying negative voltage on at least two electrodes of the electrodes of the electrostatic filter 110. In particular embodiments, a control signal from the controller 170 may cause voltage power supplies of the voltage supplies 402 to generate a DC voltage indexed between at least two electrodes, wherein a negative voltage is alternately applied between the at least two electrodes. In some examples, the negative voltage may be indexed between all electrodes of the electrostatic filter 110.

In other embodiments, a given voltage supply of the voltage supplies 402 may supply an AC voltage to a given electrode, where the AC voltage varies from zero to a set negative voltage, such as −10 kV. The AC voltage may have a waveform such as a sinusoidal waveform or other waveform. In this manner the energy and current density of ions attracted to a given electrode may vary with time. In some embodiments the frequency of the AC voltage may vary between 100 Hz and 100 kHz. The embodiments are not limited in this context. In particular embodiments, the controller 170 may generate a signal to create a phase shifted AC voltage between at least two electrodes of the electrostatic filter 110. For example, 14 different voltage supplies, such as voltage supplies 402, may be individually coupled to the 14 electrostatic elements that may constitute electrostatic elements 120 in one embodiment. A phase shifted AC voltage waveform may control the different voltage supplies 402 to individually output an AC voltages to a given electrostatic element, where the phase of the AC voltage is offset with respect to the phase of AC voltage supplied by other voltage supplies of the voltage supplies 402 applied to other electrostatic elements of the electrostatic filter. In one embodiment a phase offset between adjacent electrodes of the electrodes of electrostatic filter 110 is 360/n, where n equals a total number of the electrodes. In other embodiments, the phase offset between adjacent electrodes may be set for any given value, and the phase offset may vary between different pairs of adjacent electrodes.

Figure 4B:
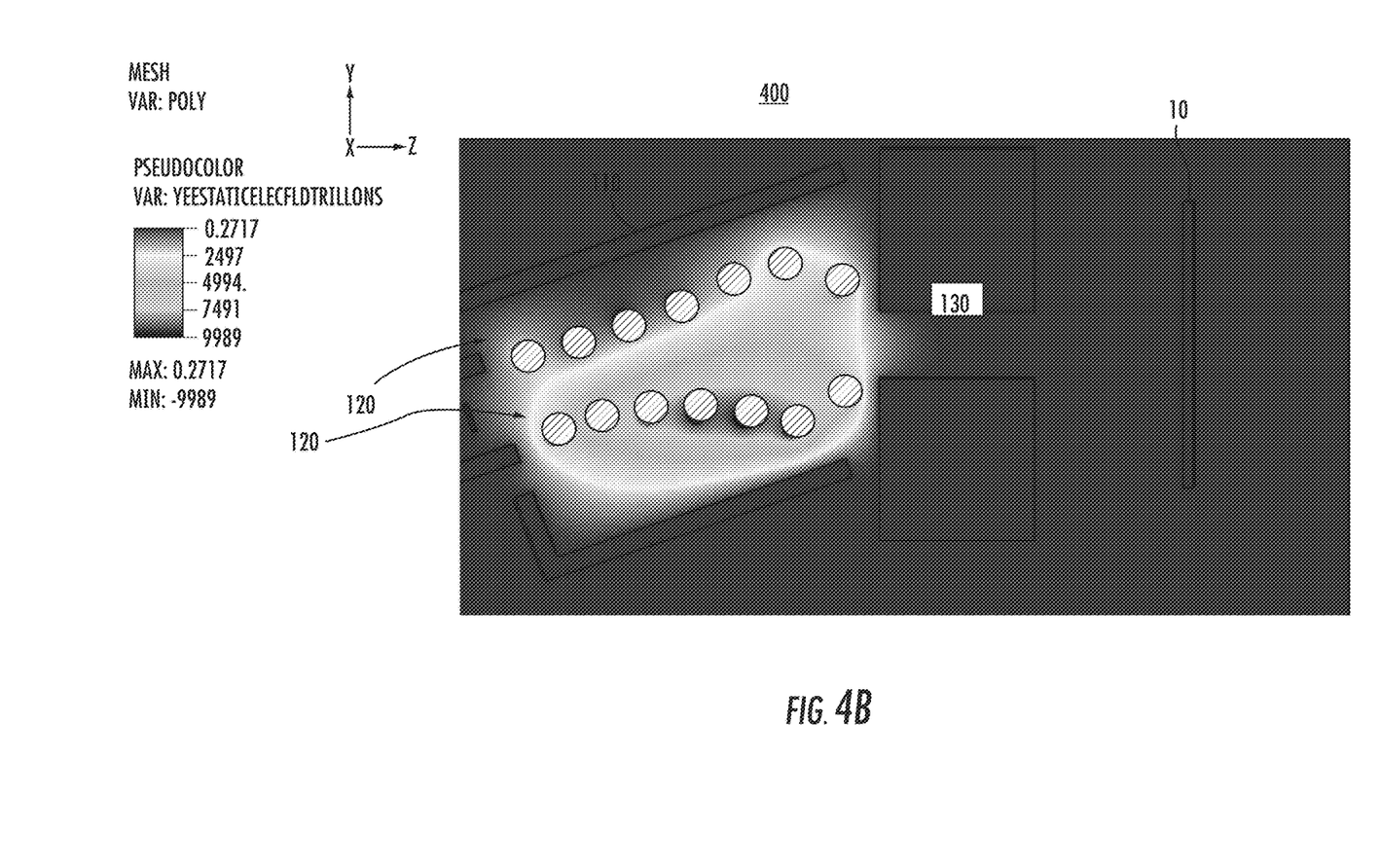
FIG. 4B shows the results of simulation of an ion beam cleaning procedure according to embodiments of the disclosure.

Turning now to FIG. 4B there is shown a qualitative representation of the results of simulation of an ion beam cleaning procedure according to embodiments of the disclosure. In this illustration, the position of several of the components of the apparatus 400 are shown using exemplary spacings between different components. Superimposed upon the positions of different electrostatic elements (electrostatic elements 120) is a two dimensional voltage map illustrating instantaneous voltage as a function of position. In this particular simulation, a phase-offset AC signal is propagated through all the electrostatic elements 120 of the electrostatic filter 110. Between any two instances in time the magnitude of the voltages on the different electrodes may vary. The simulation shown in FIG. 4B captures one instance in time. In the simulation of FIG. 4B, an AC voltage having a 5 kV amplitude, meaning the magnitude of voltage varies from 0 kV to −10 kV is applied to the electrostatic elements 120. The frequency of the applied voltage is 1 kHz and a phase offset in degrees between adjacent electrostatic elements is 360/14 for the case of a 14-electrode electrostatic filter as shown. As a result, in the simulation a "rotating" wave of a negative voltages at the electrostatic elements 120 is created, leading to the ability to create a moving ion beam(s). In the scenario of FIG. 4B a negative voltage approaching a magnitude of −10 kV is present on three lower electrostatic elements, while the voltage on other lower electrostatic elements is closer to −5 kV. Additionally, many of the upper electrostatic elements have a voltage of less than −1000 V. The voltage distribution in FIG. 4B changes rapidly, where a cycle of AC voltage is completed in 1/1000 second, so all the electrostatic elements experience voltage fluctuations between 0 V, −10 kV and back to 0V 1000 times every second.

Figure 4C:
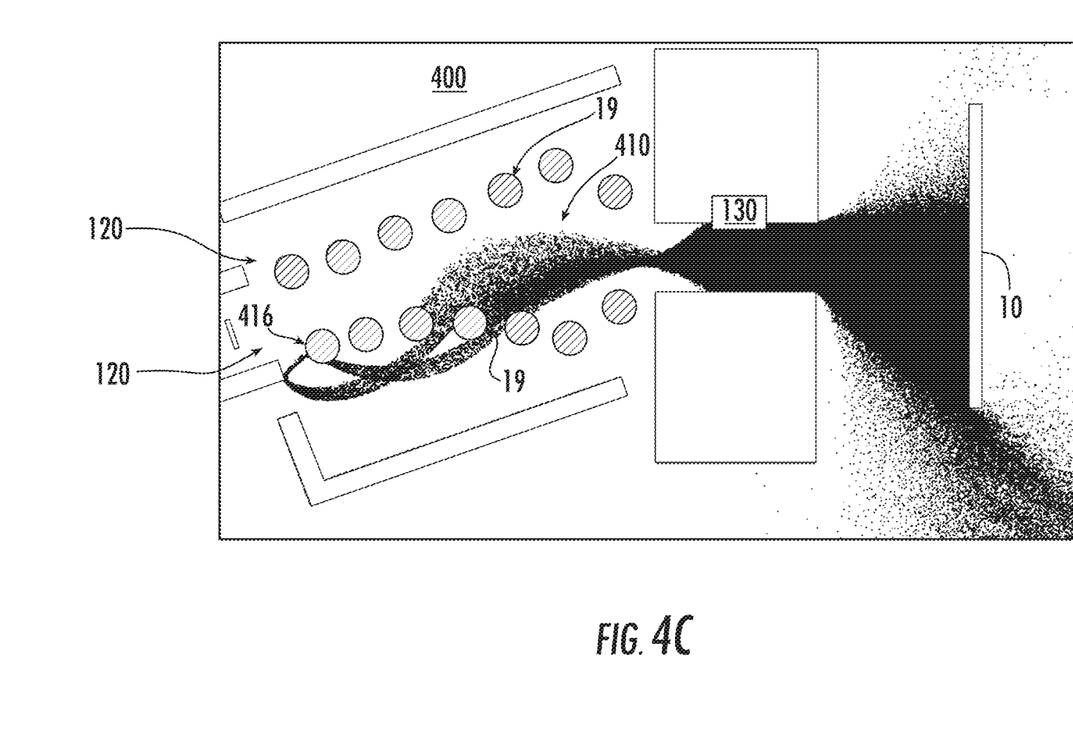
FIG. 4C illustrates a distribution of ions when the cleaning ion source is on under the scenario of FIG. 4B.

FIG. 4C illustrates a qualitative representation of the distribution of ions when the cleaning ion source 130 is on under the scenario of FIG. 4B. As shown, ions 410 stream out of the cleaning ion source 130 and are incident mainly upon three lower electrostatic elements at the instance of FIG. 4B. In addition, a part of the ions 416 strikes the opposite side of the left lower electrostatic element, demonstrating that areas which not in the line of sight from the cleaning ion source 130 may also be cleaned. The results of simulations such as shown in FIG. 4C demonstrate a large portion or an entirety of surfaces of electrostatic elements may be exposed to a "cleaning" ion beam, while the shadowed surface regions 19 are exposed to the relatively largest dose of ions 410 over time. This distribution of ions has the effect of cleaning portions of the electrostatic elements 120 tending to accumulate the most deposits during processing when an ion beam is directed from the left toward the substrate 10. As further shown in FIG. 4C, ions 410, having a slightly positive potential corresponding to the plasma potential of the cleaning ion source 130, may also stream toward other surfaces including the substrate 10, where the substrate 10 is at 0 V potential (see FIG. 4B).

In combination with any of the aforementioned embodiments, gas pressure in an electrostatic filter chamber or in a cleaning ion source may be maintained at a relatively high level to enhance cleaning of electrostatic elements by ions or radicals. Exemplary pressure elevated pressure ranges may be from 0.1 mTorr to 10 Torr. The embodiments are not limited in this context.

In various additional embodiments a cleaning ion source may be movable to perform in different manners. In some embodiments a cleaning ion source may be rotatable from a first position directing ions toward an electrostatic filter and a second position directing ions toward a substrate position. This flexibility facilitates cleaning of electrodes during a cleaning mode and processing of a substrate during processing mode using the same cleaning ion source.

Figure 5:
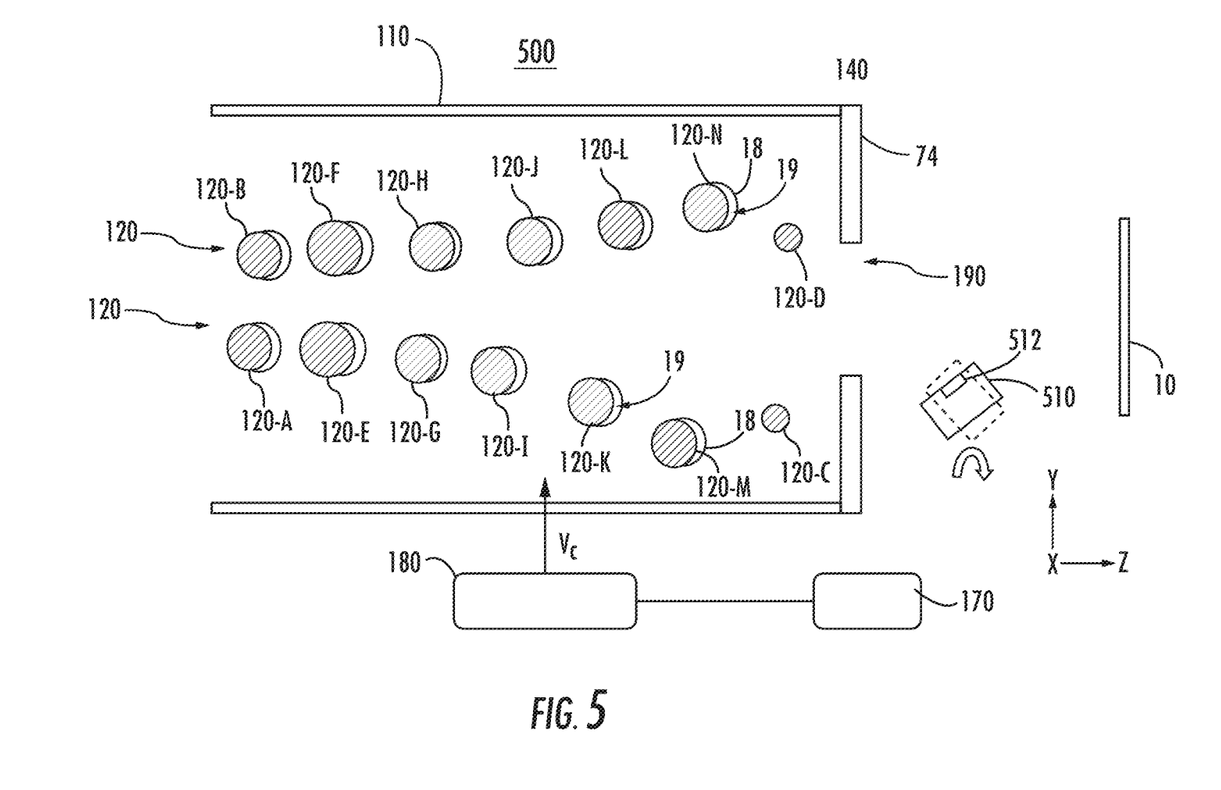
FIG. 5 depicts another embodiment of the disclosure where an apparatus includes a rotatable cleaning ion source.

FIG. 5 depicts another embodiment of the disclosure where an apparatus 500 includes a cleaning ion source 510 rotatable about the X-axis as shown. In a cleaning mode the cleaning ion source 510 may be placed in a rotational position where an aperture 512 faces toward the electrostatic filter 110, while in a processing mode the cleaning ion source 510 may be rotated so the aperture 512 faces toward the substrate 10. In the processing mode the cleaning ion source 130 may provide ions, radicals, neutrals, and chemically active species to the substrate 10, in some examples in conjunction with an ion beam directed to the substrate 10 (see ion beam 302, for example).

Figure 6:
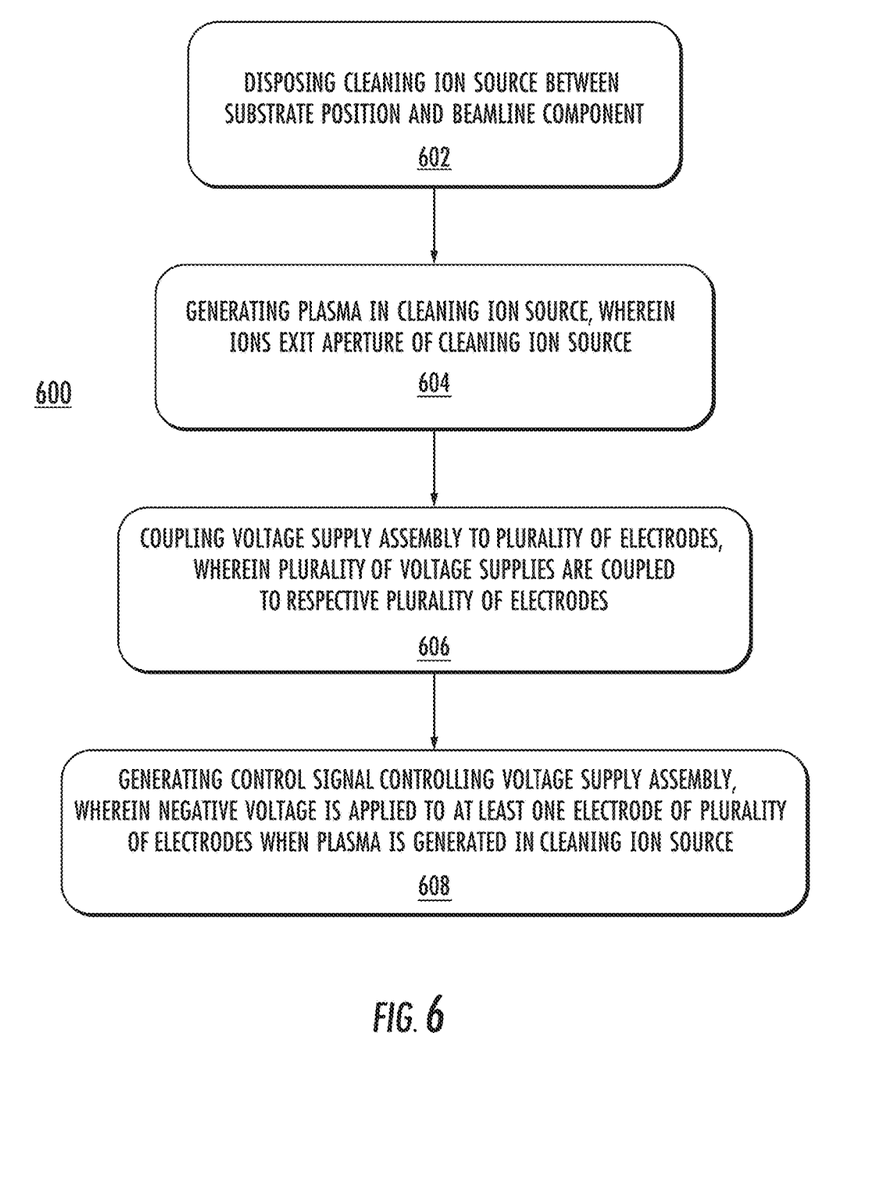
FIG. 6 depicts an exemplary process flow according to embodiments of the disclosure.

FIG. 6 depicts an exemplary process flow 600 according to embodiments of the disclosure. At block 602 the operation is performed of disposing a cleaning ion source between a substrate position and a beamline component. In some embodiments the cleaning ion source may be located between an electrostatic filter and a substrate. At block 604 the operation is performed of generating a plasma in the cleaning ion source, wherein ions exit an aperture of cleaning ion source. At block 606 a voltage supply assembly is coupled to plurality of electrodes, wherein a plurality of voltage supplies are coupled to a respective plurality of electrodes. In particular embodiments N voltage supplies are coupled to N electrodes (electrostatic elements) of an electrostatic filter. At block 608 a control signal is generated controlling the voltage supply assembly, wherein a negative voltage is applied to at least one electrode of plurality of electrodes when a plasma is generated in the cleaning ion source. In this manner ions generated by the cleaning ion source may impinge upon the at least one electrode.

While the aforementioned embodiments have focused on cleaning of electrostatic filters, in additional embodiments a cleaning ion source may be used to clean other components of a beamline. In some embodiments, the cleaning ion source may be placed at nearly any location along a beamline near a beamline component to be cleaned, where the beamline component is coupled to a voltage supply that biases the beamline component negatively with respect to the cleaning ion source (the cleaning ion source is biased positively with respect to the beamline component). This enables the beamline component to be cleaned by positive ions generated in the cleaning ion source when a plasma is generated in the cleaning ion source.

In view of the foregoing, at least the following advantages are achieved by the embodiments disclosed herein. Firstly, providing a cleaning ion source facilitates in-situ cleaning of surfaces within an ion beam apparatus tending to accumulate material during processing, such as electrodes in an electrostatic filter. A second advantage provided by some embodiments is the ability to provide in-situ cleaning of components such as electrostatic filer electrodes, while not having to perform substantial modification of an electrostatic filter. For example, various embodiments provide the ability to harness voltage supplies and electrodes of an electrostatic filter for cleaning of the electrodes, where such components may already be used to process an ion beam during a processing mode. Thirdly, in various embodiments a cleaning ion source may be used for multiple purposes including processing of a substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth of the present disclosure as described herein.

The invention claimed is:

1. An apparatus, comprising:
   an electrostatic filter having a plurality of electrodes;
   a voltage supply assembly coupled to the plurality of electrodes;
   a cleaning ion source disposed between the electrostatic filter and a substrate position, the cleaning ion source generating a plasma during a cleaning mode, wherein a dose of ions exit the cleaning ion source; and
   a controller having a first component to generate a control signal for controlling the voltage supply assembly, wherein a negative voltage is applied to at least one of the plurality of electrodes when the plasma is generated.

2. The apparatus of claim 1, the control signal generating a time a time-varying negative voltage on at least two electrodes of the plurality of electrodes.

3. The apparatus of claim 2, the control signal generating a DC voltage indexed between the at least two electrodes, wherein a negative voltage is alternately applied between different electrodes.

4. The apparatus of claim 2, the first component generating a phase shifted alternating current (AC) voltage at the at least two electrodes.

5. The apparatus of claim 1, further comprising a gas source coupled to the cleaning ion source, the gas source providing chemically active gas to the cleaning ion source, wherein chemically active ions impinge upon the plurality of electrodes.

6. The apparatus of claim 1, further comprising a gas assembly coupled to the cleaning ion source, the gas assembly providing a mixture of gases to the cleaning ion source, wherein a plurality of ion species are impinge upon the plurality of electrodes.

7. The apparatus of claim 1, wherein the voltage supply assembly comprises a plurality of voltage sources independently coupled to the plurality of electrodes, respectively.

8. The apparatus of claim 1, wherein the cleaning ion source is rotatable from a first position directing ions toward the electrostatic filter and a second position directing ions toward the substrate position.

9. The apparatus of claim 1 wherein the cleaning ion source is configured as a plasma flood source.

10. The apparatus of claim 1, wherein the cleaning ion source comprises an elongated aperture providing the dose of ions.

11. The apparatus of claim 1, wherein the cleaning ion source comprises a series of holes defining an elongated aperture providing the dose of ions.

12. A system, comprising:
a processing ion source to generate a processing ion beam in a processing mode of operation;
a beamline component disposed downstream of the processing ion source;
a cleaning ion source, separate from the processing ion source and disposed between the beamline component and a substrate position; and
a controller having a first component generate a control signal, wherein a negative voltage is applied to the beamline component with respect to the cleaning ion source when a plasma is generated in the cleaning ion source.

13. The system of claim 12,
the beamline component comprising an electrostatic filter having a plurality of electrodes; and
a voltage supply assembly comprising a plurality of voltage sources independently coupled to the plurality of electrodes, respectively; the voltage supply assembly, wherein the control signal controls the voltage supply assembly, and wherein the negative voltage is applied to at least one of the plurality of electrodes when the plasma is generated in the cleaning ion source.

14. A method, comprising:
disposing a cleaning ion source between a substrate position and an electrostatic filter having a plurality of electrodes;
generating a plasma in the cleaning ion source, wherein ions exits an aperture of the cleaning ion source;
coupling a voltage supply assembly to the plurality of electrodes, wherein a plurality of voltage supplies of the voltage supply assembly are connected to the plurality of electrodes, respectively; and
generating a control signal controlling the voltage supply assembly, wherein a negative voltage is applied to at least one of the plurality of electrodes when the plasma is generated in the cleaning ion source.

15. The method of claim 14, the controlling the voltage supply assembly comprising generating a time-varying negative voltage on at least two electrodes of the plurality of electrodes.

16. The method of claim 15, the controlling the voltage supply assembly comprising generating a DC voltage indexed between the at least two electrodes, wherein a negative voltage is alternately applied between the at least two electrodes.

17. The method of claim 15, the controlling the voltage supply assembly comprising generating a phase shifted alternating current (AC) voltage at the at least two electrodes.

18. The method of claim 17, wherein a phase offset between adjacent electrodes of the plurality of electrodes is 360/n, where n equals a total number of the plurality of electrodes.

19. The method of claim 17, wherein a frequency of the AC voltage is 100 Hz to 100 kHz.

20. The method of claim 14, wherein the negative voltage comprises a magnitude of at least 500 V.

* * * * *